(12) United States Patent
Jeon

(10) Patent No.: US 9,703,366 B2
(45) Date of Patent: Jul. 11, 2017

(54) SYSTEM-ON-CHIP INCLUDING A POWER PATH CONTROLLER AND ELECTRONIC DEVICE

(71) Applicant: SAMSUNG ELECTRONICS CO., LTD., Suwon-si (KR)

(72) Inventor: Ho-Yeon Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/740,918

(22) Filed: Jun. 16, 2015

(65) Prior Publication Data

US 2016/0109932 A1    Apr. 21, 2016

(30) Foreign Application Priority Data

Oct. 20, 2014    (KR) .................. 10-2014-0141682

(51) Int. Cl.
*G06F 1/32*    (2006.01)
*G11C 5/14*    (2006.01)

(52) U.S. Cl.
CPC ............ *G06F 1/3296* (2013.01); *G06F 1/324* (2013.01); *G06F 1/325* (2013.01); *G06F 1/3275* (2013.01); *G11C 5/14* (2013.01)

(58) Field of Classification Search
CPC .... G06F 1/3287; G06F 3/0625; G06F 3/0683; G06F 11/2015; G06F 1/26; G06F 1/3225
USPC ........................................................ 713/323
See application file for complete search history.

(56) References Cited

U.S. PATENT DOCUMENTS

| | | | |
|---|---|---|---|
| 5,367,487 A | 11/1994 | Yoshida | |
| 7,508,179 B2 | 3/2009 | Cowell et al. | |
| 7,589,993 B2 | 9/2009 | Yamaoka et al. | |
| 7,630,229 B2 | 12/2009 | Katayama | |
| 7,630,270 B2 | 12/2009 | Ko et al. | |
| 7,920,438 B2 | 4/2011 | Yamaoka et al. | |
| 7,961,546 B2 | 6/2011 | Mair et al. | |
| 8,630,139 B2 | 1/2014 | Braceras et al. | |

(Continued)

FOREIGN PATENT DOCUMENTS

| | | |
|---|---|---|
| JP | 2005-190651 A | 7/2005 |
| JP | 2006-65916 A | 3/2006 |
| JP | 5373567 B2 | 12/2013 |

*Primary Examiner* — Thomas Lee
*Assistant Examiner* — Santosh R Poudel
(74) *Attorney, Agent, or Firm* — Sughrue Mion, PLLC

(57) ABSTRACT

A system on chip (SoC) includes a plurality of function circuits including a plurality of logic circuits and a plurality of function circuits each of which includes a logic circuit and a memory, and a plurality of power path controllers respectively coupled to a plurality of first power sources at first input terminals, commonly coupled to a second power source at second input terminals, and respectively coupled to the memories at output terminals. The logic circuits are respectively coupled to the first power sources, and configured to be supplied with a plurality of first power supply voltages from the first power sources, respectively. Each of the memories is configured to be selectively supplied, by a corresponding one of the power path controllers, with one of a corresponding one of the first power supply voltages from a corresponding one of the first power sources and a second power supply voltage from the second power source.

18 Claims, 13 Drawing Sheets

(56) References Cited

U.S. PATENT DOCUMENTS

| | | | | | |
|---|---|---|---|---|---|
| 2002/0181301 | A1* | 12/2002 | Takahashi | ................ | G11C 8/18 365/200 |
| 2002/0194514 | A1* | 12/2002 | Sanchez | ................. | G06F 1/305 713/300 |
| 2004/0240269 | A1* | 12/2004 | Cernea | ..................... | G11C 8/08 365/185.12 |
| 2006/0235630 | A1* | 10/2006 | Ito | ........................ | G06F 1/3203 702/57 |
| 2010/0103760 | A1* | 4/2010 | Mair | ..................... | G11C 5/147 365/227 |
| 2010/0250980 | A1* | 9/2010 | Wang | ................... | G06F 1/3225 713/320 |
| 2010/0302877 | A1* | 12/2010 | Bang | ..................... | G11C 5/147 365/189.07 |
| 2011/0062794 | A1* | 3/2011 | Vergoossen | ............ | H04L 12/12 307/125 |
| 2012/0261987 | A1* | 10/2012 | Ha | ........................ | H02J 9/005 307/31 |
| 2012/0275256 | A1* | 11/2012 | Furutani | ................. | G11C 7/08 365/207 |
| 2013/0124888 | A1* | 5/2013 | Tanaka | .................. | G11C 16/06 713/320 |
| 2014/0139029 | A1* | 5/2014 | Gasparini | ................ | G06F 1/26 307/80 |

* cited by examiner

SYSTEM-ON-CHIP INCLUDING A POWER PATH CONTROLLER AND ELECTRONIC DEVICE

CROSS-REFERENCE TO THE RELATED APPLICATION

This application claims priority from Korean Patent Application No. 10-2014-0141682, filed on Oct. 20, 2014, in the Korean Intellectual Property Office (KIPO), the disclosure of which is incorporated by reference in its entirety herein.

BACKGROUND

1. Technical Field

Example embodiments relate generally to semiconductor devices, and more particularly to a system-on-chip (SoC) including a power path controller and an electronic device including the SOC.

2. Discussion of the Related Art

A system-on-chip (SoC) generally refers to a processing system that integrates various functional circuits (e.g., a central processing unit, a memory, an interface unit, a digital signal processing unit, an analog signal processing unit, etc.) in a single or a few semiconductor integrated circuits (ICs) to implement an electronic system, such as a computer system, using a limited number of ICs. Recently, SoCs have evolved to complex systems including various functions such as multimedia, graphics, interfaces, security functionality, etc. As diverse capabilities and functionality converge in portable devices that are battery-powered, efforts are ongoing to reduce power consumption in such portable devices while enhancing the performance thereof.

SUMMARY

At least one example embodiment of the inventive concept provides a system-on-chip (SoC) including a power path controller.

At least one example embodiment of the inventive concept provides an electronic device including the SoC.

According to example embodiments, there is provided an SoC which may include a plurality of function circuits each of which includes a logic circuit and a memory, and a plurality of power path controllers respectively coupled to a plurality of first power sources at first input terminals, commonly coupled to a second power source at second input terminals, and respectively coupled to the memories at output terminals. The logic circuits may be respectively coupled to the first power sources, and configured to be supplied with a plurality of first power supply voltages from the first power sources, respectively. Each of the memories may be configured to be selectively supplied, by a corresponding one of the power path controllers, with one of a corresponding one of the first power supply voltages from a corresponding one of the first power sources and a second power supply voltage from the second power source.

Each of the first power supply voltages may be a power supply voltage which is dynamically changed according to an operating condition of a corresponding one of the function circuits, and the second power supply voltage may be a fixed power supply voltage.

The second power supply voltage may have a voltage level the same as a voltage level of a minimum power supply voltage required by the memory cores.

The second power supply voltage may have a voltage level higher than a voltage level of a minimum power supply voltage required by the memory cores.

The power path controllers may be respectively coupled to the first power sources through a plurality of first power supply lines, and may be commonly coupled to the second power source through a single second power supply line.

Each power path controller may be configured to transfer the corresponding one of the first power supply voltages from the corresponding one of the first power sources to a corresponding one of the memories in response to the corresponding one of the first power supply voltages having a voltage level higher than a voltage level of the second power supply voltage, and transfer the second power supply voltage from the second power source to the corresponding one of the memories in response to the corresponding one of the first power supply voltages having a voltage level lower than the voltage level of the second power supply voltage.

Each power path controller may include a first switch located between the corresponding one of the first power sources and the corresponding one of the memories, a second switch located between the second power source and the corresponding one of the memories, a comparator configured to compare the corresponding one of the first power supply voltages from the corresponding one of the first power sources with the second power supply voltage from the second power source, and a switch controller configured to activate the first switch in response to the corresponding one of the first power supply voltages having the voltage level higher than the voltage level of the second power supply voltage, and activate the second switch in response to the corresponding one of the first power supply voltages having the voltage level lower than the voltage level of the second power supply voltage.

The first power supply voltage supplied from one of the first power sources may be a fixed power supply voltage, and the first power supply voltages supplied from the others of the first power sources may be power supply voltages which are dynamically changed according to operating conditions of corresponding ones of the function circuits. The second input terminals of the power path controllers may be commonly coupled to, as the second power source, the one of the first power sources supplying the fixed power supply voltage.

The first power sources may be buck converters, and the second power source may be a low dropout regulator.

The first power sources and the second power source may be included in a power management integrated circuit.

The second power source may be located inside the SoC.

According to example embodiments, the SoC may further include another function circuit comprising a logic circuit and a memory which are configured to be supplied with the second power voltage from the second power source.

Each of the first power supply voltages may be a power supply voltage which is dynamically changed according to an operating condition of a corresponding one of the function circuits.

Each of the first power supply voltages may be a power supply voltage which is dynamically changed according to an operating condition of a corresponding one of the function circuits, and the second power supply voltage may be dynamically changed according to an operating condition of the other function circuit while the second power supply voltage has a voltage level higher than or equal to a voltage level of a minimum power supply voltage required by the memories respectively included in the function circuits and the memory included in the other function circuit.

The second power source may be included in the SoC, and may generate a fixed power supply voltage as the second power supply voltage.

According to example embodiments, there is provided an electronic device which may include the above SoC and a power management integrated circuit which is connected to the SoC. The power management integrated circuit may include the plurality of first power sources configured to generate the first power supply voltages each of which is dynamically changed according to an operating condition of a corresponding one of the function circuits, and the second power source configured to generate a fixed second power supply voltage.

According to example embodiments, there is provided an SoC which may include a plurality of first function circuits belonging to a first power group, each of the first function circuits including a first logic circuit and a first memory, a plurality of second function circuits belonging to a second power group, each of the second function circuits including a second logic circuit and a second memory, a plurality of first power path controllers respectively coupled to a plurality of first power sources at first input terminals, commonly coupled to a second power source at second input terminals, and respectively coupled to the first memories at output terminals, and a plurality of second power path controllers respectively coupled to a plurality of third power sources at first input terminals, commonly coupled to a fourth power source at second input terminals, and respectively coupled to the second memories at output terminals, wherein the first logic circuits are respectively coupled to the first power sources, and are configured to be supplied with a plurality of first power supply voltages from the first power sources, respectively. The second logic circuits may be respectively coupled to the third power sources, and configured to be supplied with a plurality of third power supply voltages from the third power sources, respectively. Each of the first memories may be configured to be selectively supplied, by a corresponding one of the first power path controllers, with one of a corresponding one of the first power supply voltages from a corresponding one of the first power sources and a second power supply voltage from the second power source. Each of the second memories may be configured to be selectively supplied, by a corresponding one of the second power path controllers, with one of a corresponding one of the third power supply voltages from a corresponding one of the third power sources and a fourth power supply voltage from the fourth power source.

Each of the first power supply voltages may be a power supply voltage which is dynamically changed according to an operating condition of a corresponding one of the first function circuits, and the second power supply voltage may be a power supply voltage fixed to a minimum power supply voltage required by the first memories. Also, each of the third power supply voltages may be a power supply voltage which is dynamically changed according to an operating condition of a corresponding one of the second function circuits, and the fourth power supply voltage may be a power supply voltage fixed to a minimum power supply voltage required by the second memories.

According to example embodiments, there is provided an SoC which may include a first function circuit including a logic circuit and a first memory, and a second function circuit including a second memory. Here, the logic circuit may be configured to be supplied with a first voltage which is dynamically changed according to an operating condition of the first function circuit, and each of the first and second memories may be configured to be selectively supplied with one of the first voltage and a second voltage which is the same as or higher than a minimum voltage required by the first and second memories, while the second voltage is supplied from one single power source.

The SoC and the electronic device according to example embodiments may allow memories to share at least one power source that generates a power supply voltage corresponding to the minimum power supply voltage required by the memories, thereby reducing the number of power supply lines between a power management integrated circuit (PMIC) and the SoC and reducing the number of passive elements and the size of the PMIC.

Furthermore, the SoC and the electronic device according to example embodiments may selectively supply each memory with a first power supply voltage that is dynamically changed according to an operating condition of a function circuit or a second power supply voltage that is fixed to the minimum power supply voltage required by the memory, thereby reducing the power consumption and ensuring the normal operation of the memory.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EXEMPLARY EMBODIMENTS

Figure 1:
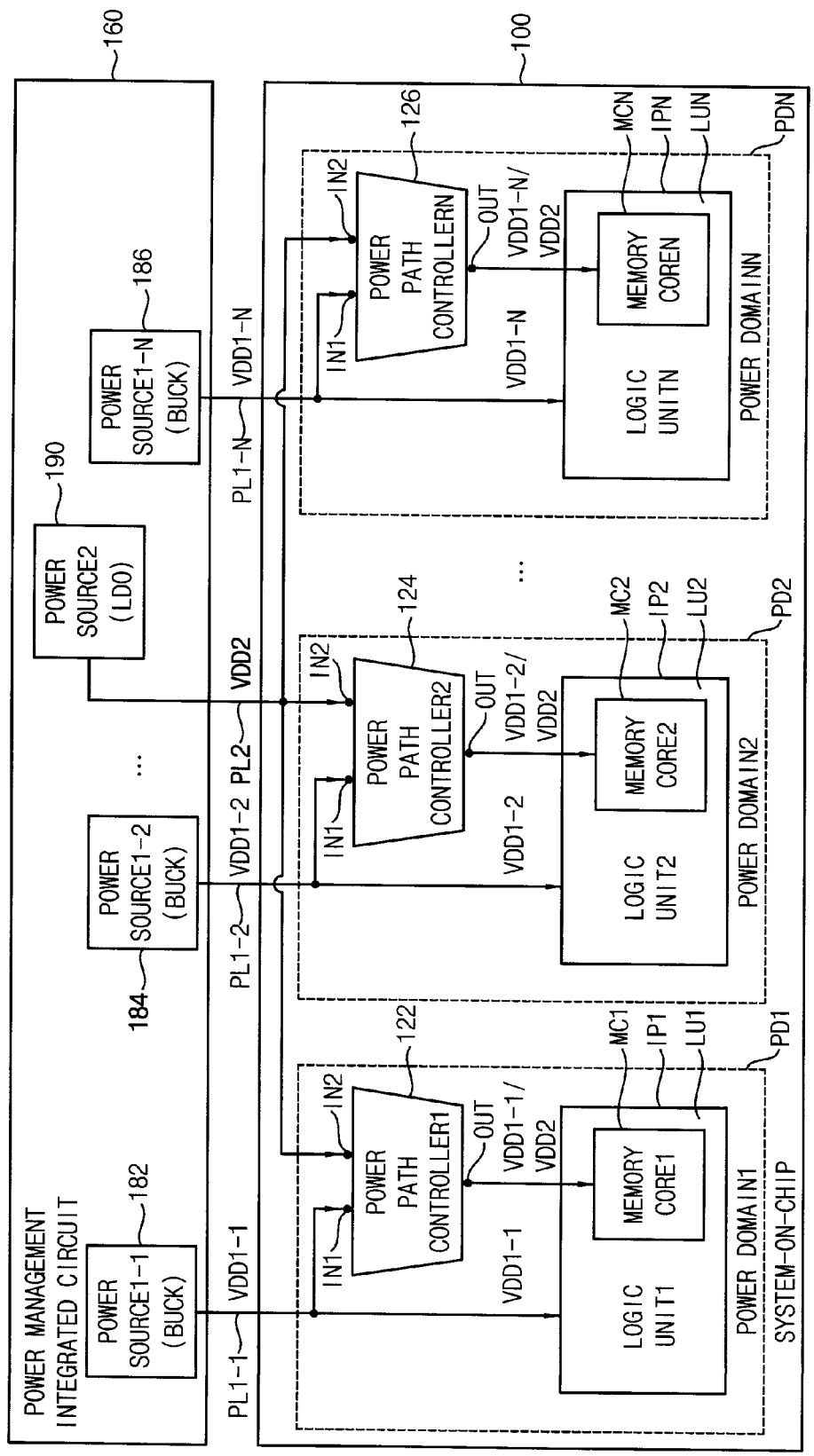
FIG. 1 is a block diagram illustrating a system-on-chip (SoC) according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
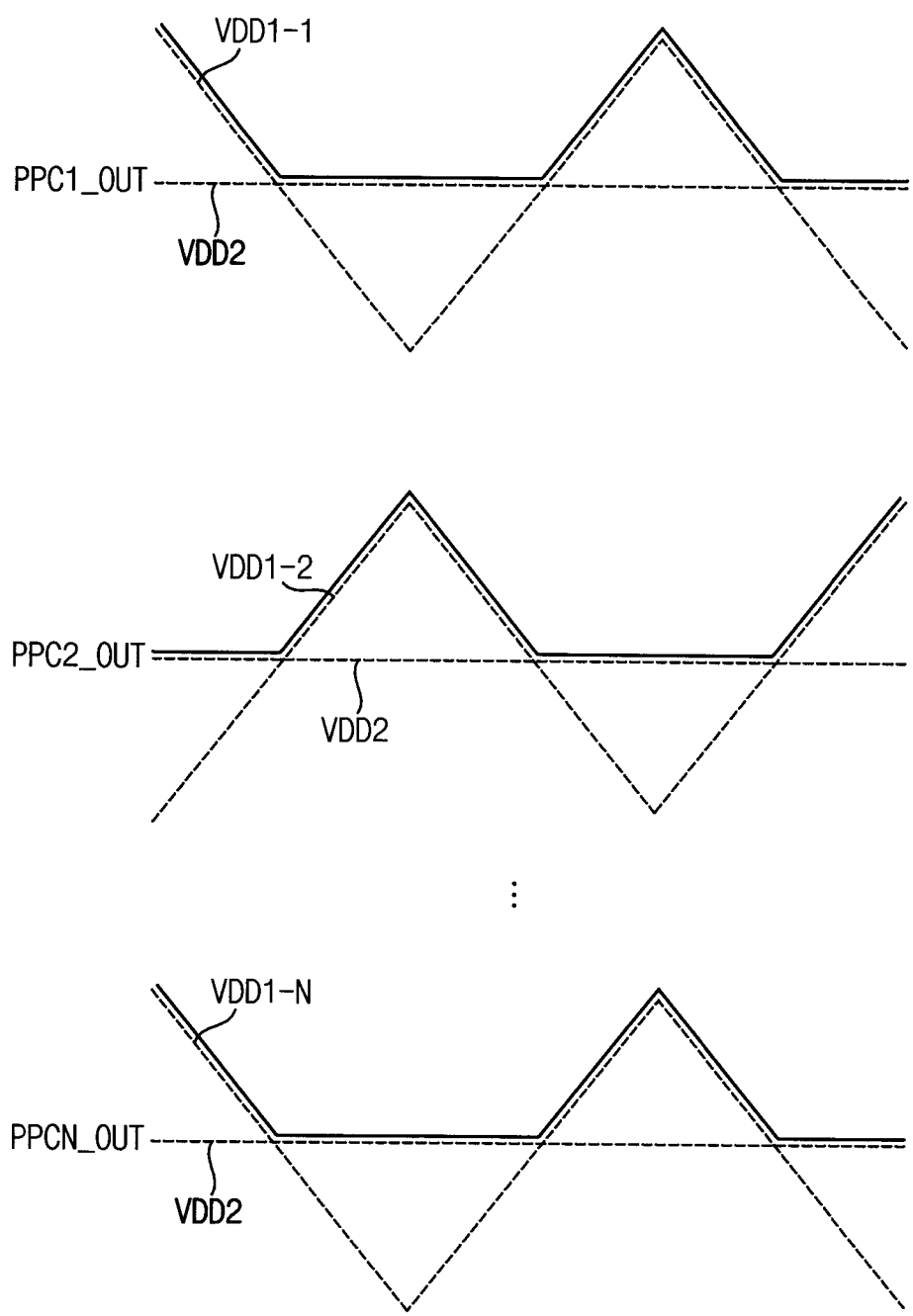
FIG. 2 is a timing diagram illustrating examples of power supply voltages supplied to memory cores illustrated in FIG. 1.
Figure 3:
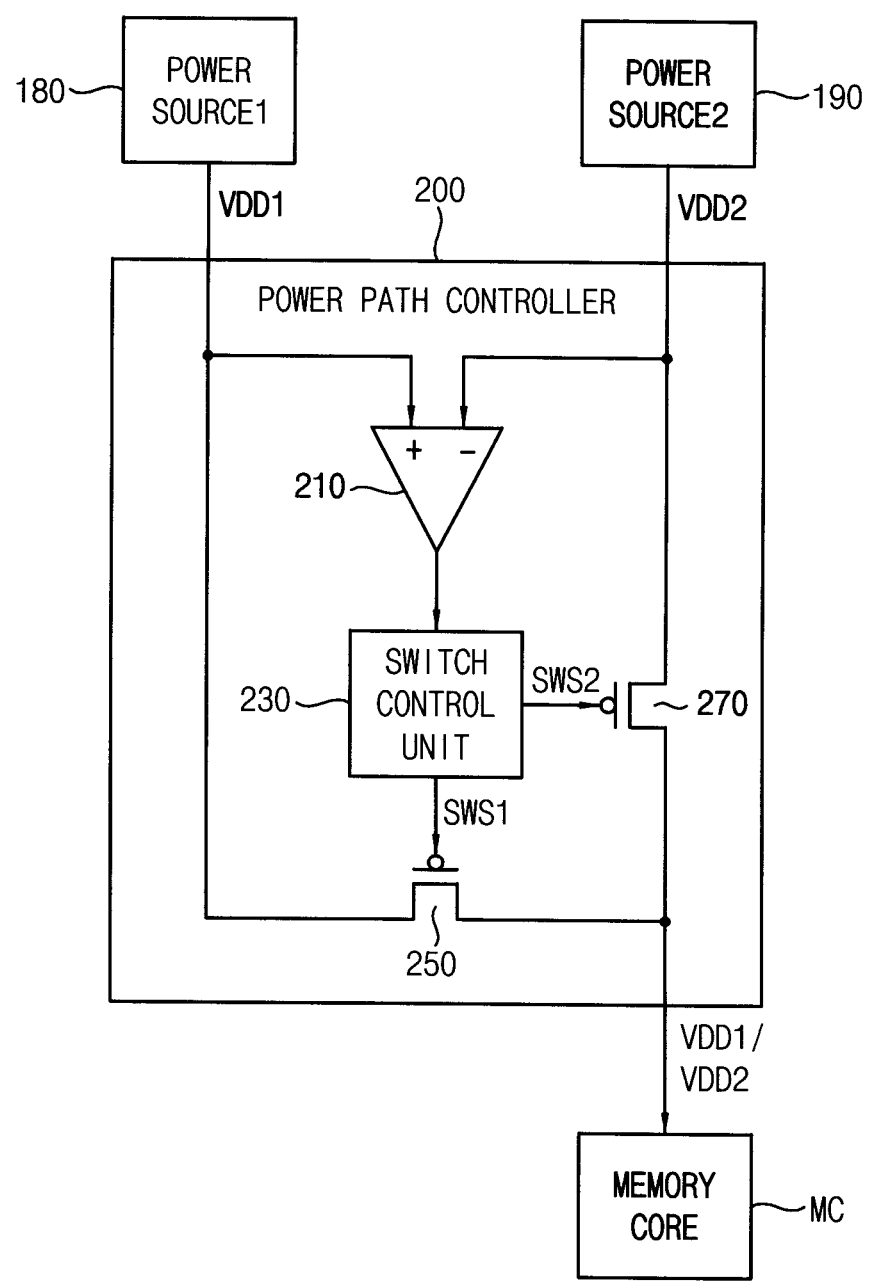
FIG. 3 is a block diagram illustrating an example of a power path controller included in a SoC of FIG. 1.

FIG. 1 is a block diagram illustrating a system-on-chip (SoC) according to example embodiments, FIG. 2 is a timing diagram illustrating examples of power supply voltages supplied to memory cores illustrated in FIG. 1, and FIG. 3 is a block diagram illustrating an example of a power path controller included in a SoC of FIG. 1.

Referring to FIG. 1, a system-on-chip (SoC) 100 includes a plurality of function circuits IP1, IP2 and IPN, and a plurality of power path controllers (PPCs) 122, 124 and 126. For example, the SoC 100 may be an application processor (AP) included in an electronic device such as a mobile device.

The function circuits IP1, IP2 and IPN may be circuits or intellectual properties (IPs) performing various functions. For example, the function circuits IP1, IP2 and IPN may include a central processing unit (CPU), a graphic processing unit (GPU), a bus system, an image signal processor (ISP), a multi-format codec (MFC) block, a file system (FSYS) block, a memory controller (MC), or the like. In some example embodiments, the function circuits IP1, IP2 and IPN may belong to different power domains PD1, PD2 and PDN, or at least one of the function circuits IP1, IP2 and IPN may belong to one same power domain among PD1, PD2 and PDN.

Each function block IP1, IP2 and IPN may include a logic circuit LU1, LU2 and LUN and a memory core MC1, MC2 and MCN, respectively. Here, the memory core MC1, MC2 and MCN may mean a memory cell array including a volatile memory cell that is continuously supplied with a power supply voltage to retain stored data, or may collectively mean the memory cell array, including the volatile memory cell, and at least a portion (e.g., at least one of a row decoder, a column selector, a write driver or a sense amplifier) of a peripheral circuit that performs a write/read operation for the memory cell array. In some example embodiments, the memory core MC1, MC2 and MCN may be a memory cell array including a static random access memory (SRAM) cell, or a collection of the memory cell array, including the SRAM cell, and at least a portion of a peripheral circuit for the memory cell array. In other example embodiments, the memory core MC1, MC2 and MCN may be a memory cell array including a dynamic random access memory (DRAM) cell, or a collection of the memory cell array, including the DRAM cell, and at least a portion of a peripheral circuit for the memory cell array. The logic circuit LU1, LU2 and LUN may perform related operations or processes for functions of each function circuit IP1, IP2 and IPN. Each logic circuit LU1, LU2 and LUN may include at least a portion (e.g., at least one of the row decoder, the column selector, the write driver or the sense amplifier) or all of the peripheral circuit for the memory cell array.

In some example embodiments, the logic circuits LU1, LU2 and LUN included in the function circuits IP1, IP2 and IPN, or the peripheral circuits included in the logic circuits LU1, LU2 and LUN may be supplied with power from a plurality of first power sources 182, 184 and 186 included in a power management integrated circuit (PMIC) 160, respectively. The logic circuits LU1, LU2 and LUN (or the peripheral circuits included in the logic circuits LU1, LU2 and LUN) may be respectively coupled to the first power sources 182, 184 and 186, and may respectively receive a plurality of first power supply voltages VDD1-1, VDD1-2 and VDD1-N from the first power sources 182, 184 and 186.

In some example embodiments, each first power source 182, 184 and 186 may dynamically change the first power supply voltage VDD1-1, VDD1-2 and VDD1-N according to an operating condition (e.g., a required throughput or a required operating speed) of a corresponding one of the function circuit IP1, IP2 and IPN. In some example embodiments, to reduce power consumption of the SoC 100, a dynamic voltage frequency scaling (DVFS) technique that dynamically changes a power supply voltage and/or an operating frequency may be applied to the SoC 100. For example, when a low throughput or a low operating speed is required with respect to a first function circuit IP1, a first power source 182 that supplies power to the logic circuit LU1 of the first function circuit IP1 may decrease a voltage level of the first power supply voltage VDD1-1 applied to the logic circuit LU1 of the first function circuit IP1 to reduce the power consumption.

In some cases, the operating conditions of the function circuits IP1, IP2 and IPN may be different from one another, and thus voltage levels of the first power supply voltages VDD1-1, VDD1-2 and VDD1-N required by the function circuits IP1, IP2 and IPN may be different from one another. In some example embodiments, the function circuits IP1, IP2 and IPN may belong to the different power domains PD1, PD2 and PDN, the function circuits IP1, IP2 and IPN may be supplied with the first power supply voltages VDD1-1, VDD1-2 and VDD1-N from the first power sources 182, 184 and 186, respectively, and the respective first power sources 182, 184 and 186 may generate the first power supply voltages VDD1-1, VDD1-2 and VDD1-N having voltage levels that are suitable for the corresponding function circuits IP1, IP2 and IPN. Accordingly, the power consumption of the function circuits IP1, IP2 and IPN may be minimized, and thus the power consumption of the SoC 100 may be minimized. In some example embodiments, each power domain PD1, PD2 and PDN may include one or more function circuits, and the number of the first power sources 182, 184 and 186 included in the PMIC 160 may correspond to the number of the power domains PD1, PD2 and PDN included in the SoC 100.

In some example embodiments, to have high power efficiency, the first power sources 182, 184 and 186 may be implemented with buck converters (BUCK) having high power conversion efficiency. For example, a power supply voltage from a battery of an electronic device may be converted into the first power supply voltages VDD1-1, VDD1-2 and VDD1-N by the buck converters, and thus the power efficiency of the electronic device may be improved. In other example embodiments, each first power source 182, 184 and 186 may be implemented with a low dropout (LDO) regulator, or other converters or regulators.

Although the logic circuits LU1, LU2 and LUN (or the peripheral circuits included in the logic circuits LU1, LU2 and LUN) are supplied with the first power supply voltages VDD1-1, VDD1-2 and VDD1-N that are dynamically changed to reduce the power consumption of the SoC 100, operation stability of memory cells may not be ensured at a low power supply voltage since a distribution of characteristics of the memory cells has widened as the semiconductor manufacturing process has been continuously developed, and thus the minimum power supply voltage for a normal operation of the memory cores MC1, MC2 and MCN may be higher than the minimum power supply voltage for a normal operation of the logic circuits LU1, LU2 and LUN. Accordingly, a power supply voltage applied to the memory cores MC1, MC2 and MCN should be higher than or equal to the minimum power supply voltage for the normal operation of the memory cores MC1, MC2 and MCN. Further, to ensure the operation stability of each memory core MC1, MC2 and MCN, it may be desirable that the power supply voltage applied to each memory core MC1, MC2 and MCN is higher than or equal to the power supply voltage applied to the corresponding peripheral circuit. Here, if the memory cores MC1, MC2 and MCN have different minimum power supply voltages for respective normal operations, the minimum power supply voltage for the normal operation of the memory cores MC1, MC2 and MCN may refer to the lowest voltage among the different minimum power supply voltages.

In some example embodiments, to ensure this operation stability of the memory cores MC1, MC2 and MCN, the SoC 100 may receive a second power supply voltage VDD2 that is a fixed power supply voltage from at least one second power source 190 included in the PMIC 160. In some example embodiments, the second power supply voltage VDD2 may have a voltage level the same as a voltage level of the minimum power supply voltage required by the memory cores MC1, MC2 and MCN. In other example embodiments, the second power supply voltage VDD2 may have a voltage level higher than a voltage level of the minimum power supply voltage required by the memory cores MC1, MC2 and MCN. In some example embodiments, to generate the second power supply voltage VDD2 that is stable with less noise (e.g., ripple), the second power source 190 may be implemented with a low dropout (LDO) regulator. Further, in some example embodiments, to improve the power efficiency, the power supply voltage of the battery may be first converted by a buck converter, and then may be converted again into the second power supply voltage VDD2 by the LDO regulator. In other example embodiments, the second power source 190 may be implemented with the buck converter, or other converters or regulators. Further, the SoC 100 may selectively supply the corresponding first power supply voltages VDD1-1, VDD1-2 and VDD1-N or the second power supply voltage VDD2 to the respective memory cores MC1, MC2 and MCN by using the power path controllers 122, 124 and 126.

The power path controllers 122, 124 and 126 may be respectively coupled to the first power sources 182, 184 and 186 at first input terminals IN1, may be commonly coupled to the second power source 190 at second input terminals IN2, and may be respectively coupled to the memory cores MC1, MC2 and MCN at output terminals OUT. Each power path controller 122, 124 and 126 may compare a corresponding one of the first power supply voltages VDD1-1, VDD1-2 and VDD1-N from a corresponding one of the first power sources 182, 184 and 186 with the second power supply voltage VDD2 from the second power source 190, and may selectively provide the corresponding one of the first power supply voltages VDD1-1, VDD1-2 and VDD1-N or the second power supply voltage VDD2 to a corresponding one of the memory cores MC1, MC2 and MCN according to a result of the comparison. Thus, while the power supply voltage suitable for the operating condition of each function circuit IP1, IP2 and IPN is supplied to the corresponding memory core MC1, MC2 and MCN, it may be ensured that the power supply voltage supplied to the corresponding memory core MC1, MC2 and MCN is higher than or equal to the minimum power supply voltage required by the memory core MC1, MC2 and MCN.

For example, as illustrated in FIG. 2, the first power supply voltages VDD1-1, VDD1-2 and VDD1-N may be dynamically changed according to the operating conditions of the corresponding function circuits IP1, IP2 and IPN, and the second power supply voltage VDD2 may be fixed to the minimum power supply voltage required by the memory cores MC1, MC2 and MCN or to a power supply voltage higher than the minimum power supply voltage. Each power path controller 122, 124 and 126 may transfer, as an output power supply voltage PPC1_OUT, PPC2_OUT and PPC-N_OUT, a higher one of the corresponding first power supply voltage VDD1-1, VDD1-2 and VDD1-N and the second power supply voltage VDD2 to the corresponding memory core MC1, MC2 and MCN. That is, each memory core MC1, MC2 and MCN may be supplied, by the corresponding power path controller 122, 124 and 126, with the higher one of the corresponding first power supply voltage VDD1-1, VDD1-2 and VDD1-N from the corresponding first power source 182, 184 and 186 and the second power supply voltage VDD2 from the second power source 190. Accordingly, each memory core MC1, MC2 and MCN may be supplied with the power supply voltage higher than or equal to the minimum power supply voltage required by the memory cores MC1, MC2 and MCN, and thus the operation stability of each memory core MC1, MC2 and MCN may be ensured.

Referring to FIG. 3, in some example embodiments, each power path controller 200 may transfer the first power supply voltage VDD1 from the first power source 180 to the memory core MC when the first power supply voltage VDD1 from the first power source 180 has a voltage level higher than a voltage level of the second power supply voltage VDD2 from the second power source 190, and may transfer the second power supply voltage VDD2 from the second power source 190 to the memory core MC when the second power supply voltage VDD2 from the second power source 190 has a voltage level higher than a voltage level of the first power supply voltage VDD1 from the first power source 180. To perform this operation, each power path controller 200 may include a first switch 250 located between the first power source 180 and the memory core MC, a second switch 270 located between the second power source 190 and the memory core MC, a comparator 210 that compares the first power supply voltage VDD1 from the first power source 180 with the second power supply voltage VDD2 from the second power source 190, and a switch controller 230 that selectively actives the first switch 250 or the second switch 270 according to a result of the comparison. For example, the switch controller 230 may generate a first switching signal SWS1 to activate the first switch 250 when the first power supply voltage VDD1 is higher than the second power supply voltage VDD2, and may generate a second switching signal SWS2 to activate the second switch 270 when the second power supply voltage VDD2 is higher than the first power supply voltage VDD1.

In some example embodiments, each power path controller 200 may further include a first resistor between the switch controller 230 and the first switch 250, and a second resistor between the switch controller 230 and the second switch 270, thereby preventing voltage/current peaking caused by a sudden switch of power supply paths. In some example embodiments, the first and second switches 250 and 270 may be PMOS transistors, and each power path controller 200 may further include first PMOS transistors that apply a higher one of a voltage of a source of the first switch 250 and a voltage of a drain of the first switch 250 to a body of the first switch 250 in response to the first switching signal SWS1, and second PMOS transistors that apply a higher one of a voltage of a source of the second switch 270 and a voltage of a drain of the second switch 270 to a body of the second switch 270 in response to the second switching signal SWS2. Accordingly, a current leakage through the bodies of the first and second switches 250 and 270 may be prevented. In some example embodiments, each power path controller 200 may further include a low pass filter at each input terminal of the comparator 210, and the comparator 210 may be a hysteresis comparator. Accordingly, a noise of the first and second power supply voltages VDD1 and VDD2 and undesired power path switching or repeated switching caused by a change of a load current of the memory core MC may be prevented. In some example embodiments, the switch controller 230 may further receive an external control signal, and may operate in response to the external control signal.

To ensure that power supply voltages higher than or equal to the minimum power supply voltage required for the normal operation of the memory cores MC1, MC2 and MCN while the power supply voltages corresponding to current operating conditions of the function circuits IP1, IP2 and IPN are supplied to the function circuits IP1, IP2 and IPN, respectively, a related art SoC are coupled not only to a plurality of first power sources for respectively supplying power to the function circuits IP1, IP2 and IPN but also to a plurality of second power sources for respectively supplying power to the memory cores MC1, MC2 and MCN, and each second power source for the related art SoC dynamically changes the power supply voltage supplied to the corresponding memory core MC1, MC2 and MCN according to the operating condition while maintaining the power supply voltage higher than or equal to the minimum power supply voltage. Accordingly, in the related art SoC, a same number of power sources as the memory cores MC1, MC2 and MCN are required to supply power to the memory cores MC1, MC2 and MCN, and thus a corresponding number of power supply lines are required between the memory cores MC1, MC2 and MCN and the power sources.

However, in the SoC 100 according to the example embodiments, the plurality of power domains PD1, PD2 and PDN may share the second power source 190 generating the second power supply voltage VDD2 that is a fixed power supply voltage corresponding to the minimum power supply voltage required by the memory cores MC1, MC2 and MCN. For example, the power path controllers 122, 124 and 126 may be coupled to the first power sources 182, 184 and 186 through a plurality of first power supply lines PL1-1, PL1-2 and PL1-N, respectively, and may be commonly coupled to the second power source 190 through a single second power supply line PL2. Accordingly, in the SoC 100 according to example embodiments, the number of the second power source 190 included in the PMIC 160 may be reduced, the number of passive elements (e.g., capacitors) for the second power source 190 may be reduced, and the number of the power supply lines PL1-1, PL1-2, PL1-N and PL2 between the PMIC 160 and the SoC 100 may be reduced.

As described above, in the SoC 100 according to the example embodiments, each power path controller 122, 124 and 126 may compare the first power supply voltage VDD1-1, VDD1-2 and VDD1-N that is dynamically changed according to the operating condition of the corresponding function circuit IP1, IP2 and IPN with the second power supply voltage VDD2 that is the fixed power supply voltage corresponding to the minimum power supply voltage required by the memory cores MC1, MC2 and MCN, and may selectively provide the power supply voltage VDD1-1, VDD1-2 and VDD1-N or the second power supply voltage VDD2 to the corresponding memory core MC1, MC2 and MCN according to the result of the comparison. Accordingly, the normal operation of the memory cores MC1, MC2 and MCN may be ensured while reducing the power consumption. Further, the SoC 100 according to the example embodiments may allow the second power source 190 that generates the second power supply voltage VDD2 to be shared by the plurality of power domains PD1, PD2 and PDN or the plurality of function circuits IP1, IP2 and IPN, thereby reducing the number of the second power source 190 in the PMIC 160, the number of the passive elements and the number of the power supply lines PL1-1, PL1-2, PL1-N and PL2 between the PMIC 160 and the SoC 100.

Figure 4:
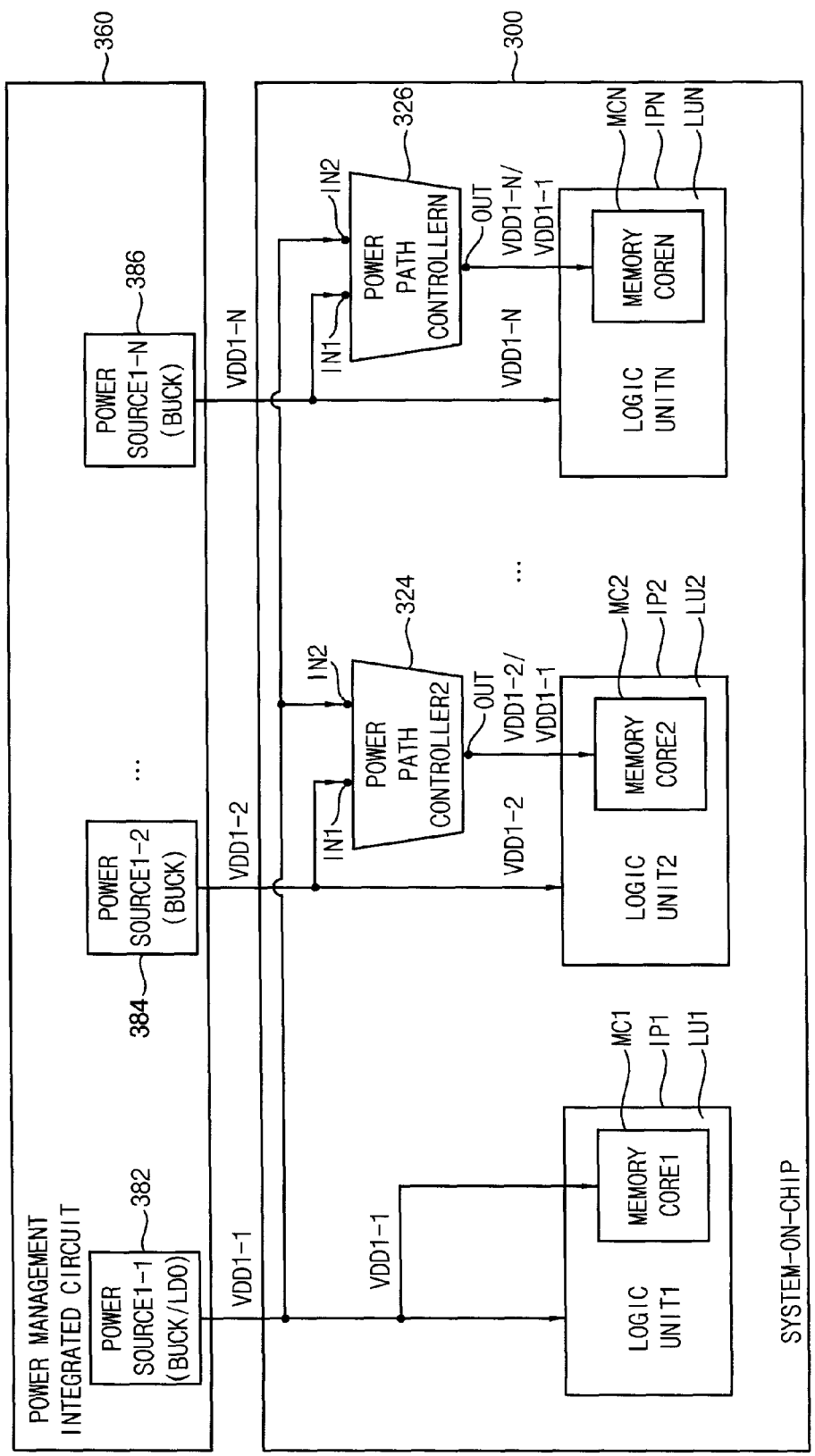
FIG. 4 is a block diagram illustrating a SoC according to example embodiments.
Figure 5:
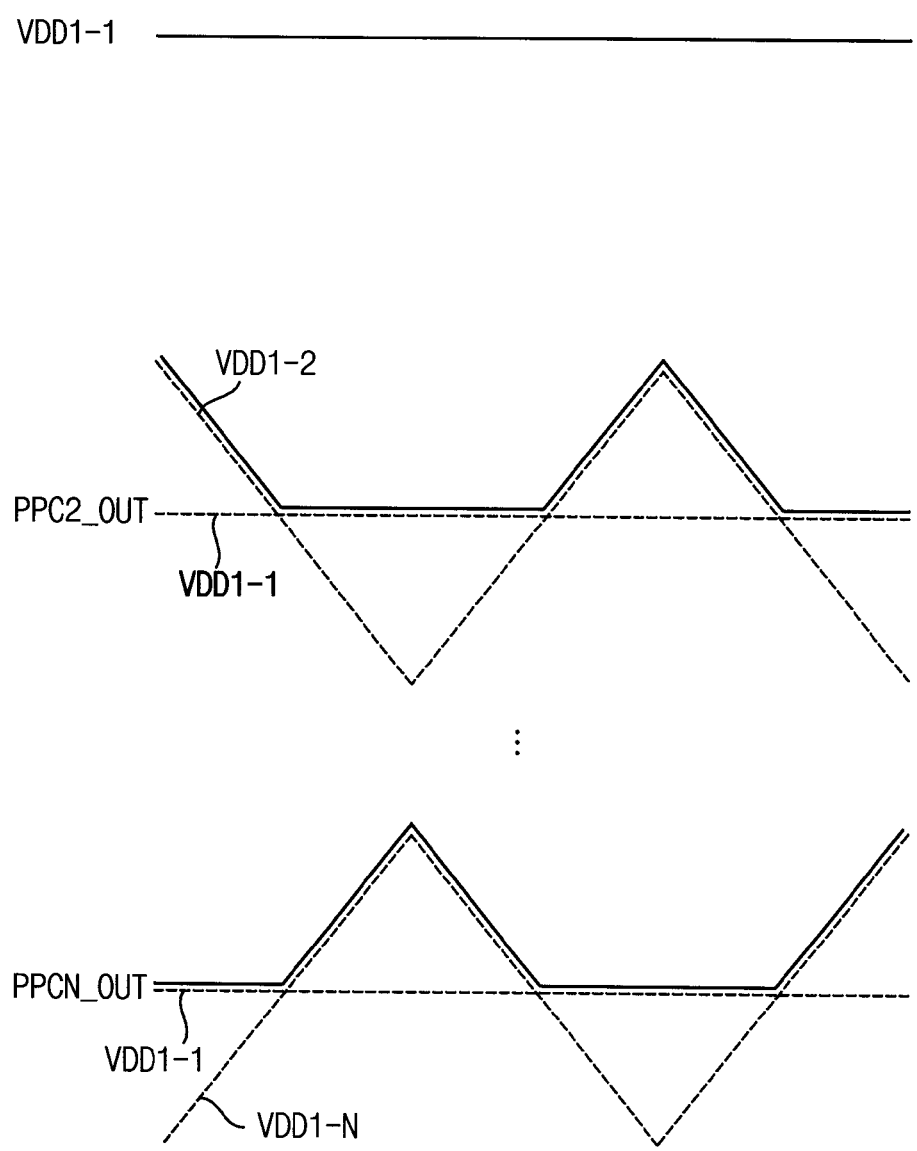
FIG. 5 is a timing diagram illustrating examples of power supply voltages supplied to memory cores illustrated in FIG. 4.
Figure 6:
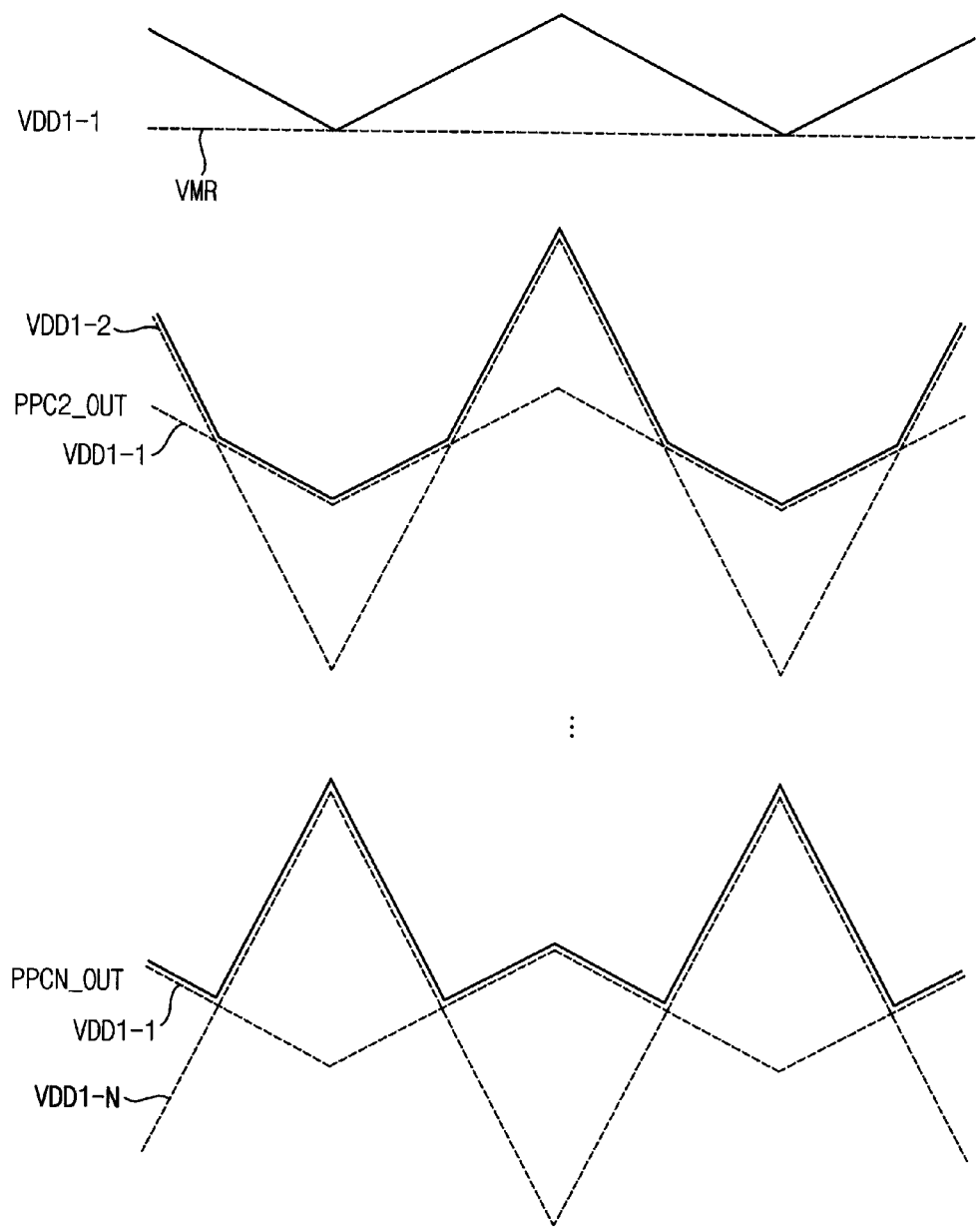
FIG. 6 is a timing diagram illustrating other examples of power supply voltages supplied to memory cores illustrated in FIG. 4.

FIG. 4 is a block diagram illustrating a SoC according to example embodiments, FIG. 5 is a timing diagram illustrating examples of power supply voltages supplied to memory cores illustrated in FIG. 4, and FIG. 6 is a timing diagram illustrating other examples of power supply voltages supplied to memory cores illustrated in FIG. 4.

Referring to FIG. 4, a SoC 300 includes a plurality of function circuits IP1, IP2 and IPN, and at least one power path controller 324 and 326. The SoC 300 of FIG. 4 may have a similar configuration to a SoC 100 of FIG. 1, except that one power source 382 of a plurality of power sources 382, 384 and 386 that are respectively coupled to the function circuits IP1, IP2 and IPN is shared instead of a second power source 190 illustrated in FIG. 1.

The function circuits IP1, IP2 and IPN may be coupled to the power sources 382, 384 and 386 included in a PMIC 360, respectively. A plurality of logic circuits LU1, LU2 and LUN respectively included in the function circuits IP1, IP2 and IPN (or peripheral circuits included in the logic circuits LU1, LU2 and LUN) may be supplied with a plurality of power supply voltages VDD1-1, VDD1-2 and VDD1-N from the power sources 382, 384 and 386, respectively.

In some example embodiments, the one power source 382 of the power sources 382, 384 and 386 may supply a fixed power supply voltage VDD1-1, and the other power sources 384 and 386 of the power sources 382, 384 and 386 may supply power supply voltages VDD1-2 and VDD1-N that are dynamically changed according to operating conditions of the corresponding function circuits IP2 and IPN. For example, the fixed power supply voltage VDD1-1 supplied by the one power source 382 may have a voltage level the same as a voltage level of a minimum power supply voltage required by memory cores MC1, MC2 and MCN, or may have a voltage level higher than the voltage level of the minimum power supply voltage. According to example embodiments, each of the one power source 382 supplying the fixed power supply voltage VDD1-1 and the other power sources 384 and 386 supplying the dynamically changed power supply voltages VDD1-2 and VDD1-N may be implemented with a buck converter, an LDO regulator, or the like.

The memory core MC1 included in the function circuit IP1 corresponding to the one power source 382 supplying the fixed power supply voltage VDD1-1 may directly receive the fixed power supply voltage VDD1-1 from the one power source 382, and the memory cores MC2 and MCN included in the function circuits IP2 and IPN corresponding to the other power source 384 and 386 supplying the dynamically changed power supply voltages VDD1-2 and VDD1-N may be selectively supplied with the dynamically changed power supply voltages VDD1-2 and VDD1-N, respectively, or the fixed power supply voltage VDD1-1 by the power path controllers 324 and 326.

For example, as illustrated in FIG. 5, the one power source 382 may generate the fixed power supply voltage VDD1-1 having a voltage level the same as or higher than the voltage level of the minimum power supply voltage required by the memory cores MC1, MC2 and MCN, and the memory core MC1 included in the function circuit IP1 corresponding to the one power source 382 may directly receive the fixed power supply voltage VDD1-1 from the one power source 382. The power path controllers 324 and 326 may be commonly coupled to the one power source 382 at second input terminals 1N2 to receive the fixed power supply voltage VDD1-1, and may be respectively coupled to the other power sources 384 and 386 at first input terminals IN1 to respectively receive the dynamically changed power supply voltages VDD1-2 and VDD1-N. Each power path controller 324 and 326 may output, as an output power supply voltage PPC2_OUT and PPCN_OUT, a higher one of the dynamically changed power supply voltage VDD1-2 and VDD1-N from the corresponding power source 384 and 386 and the fixed power supply voltage VDD1-1 at an output terminal OUT such that the higher one of the dynamically changed power supply voltage VDD1-2 and VDD1-N and the fixed power supply voltage VDD1-1 is supplied to the corresponding memory core MC2 and MCN. Accordingly, the operation stability of the memory cores MC1, MC2 and MCN may be ensured while the power consumption of the SoC 300 may be reduced.

In other example embodiments, the one power source 382 of the power sources 382, 384 and 386 may supply a power supply voltage VDD1-1 that is dynamically changed according to the operating condition of the corresponding function circuit IP1 while a voltage level of the power supply voltage VDD1-1 is maintained to be higher than or equal to the voltage level of the minimum power supply voltage required by the memory cores MC1, MC2 and MCN, and the other power sources 384 and 386 of the power sources 382, 384 and 386 may supply power supply voltages VDD1-2 and VDD1-N that are dynamically changed according to operating conditions of the corresponding function circuits IP2 and IPN.

For example, as illustrated in FIG. 6, the one power source 382 may generate the power supply voltage VDD1-1 of which the voltage level is dynamically changed while being maintained to be higher than or equal to that of the minimum power supply voltage VMR, and the memory core MC1 included in the function circuit IP1 corresponding to the one power source 382 may directly receive the power supply voltage VDD1-1 of which the voltage level is dynamically changed while being maintained to be higher than or equal to that of the minimum power supply voltage VMR from the one power source 382. The power path controllers 324 and 326 may be commonly coupled to the one power source 382 at the second input terminals IN2 to receive the power supply voltage VDD1-1 of which the voltage level is dynamically changed while being maintained to be higher than or equal to that of the minimum power supply voltage VMR, and may be respectively coupled to the other power sources 384 and 386 at the first input terminals IN1 to respectively receive the dynamically changed power supply voltages VDD1-2 and VDD1-N. Each power path controller 324 and 326 may output, as the output power supply voltage PPC2_OUT and PPCN_OUT, a higher one of the dynamically changed power supply voltage VDD1-2 and VDD1-N from the corresponding power source 384 and 386 and the power supply voltage VDD1-1 of which the voltage level is dynamically changed while being maintained to be higher than or equal to that of the minimum power supply voltage VMR at the output terminal OUT such that the higher one of the dynamically changed power supply voltage VDD1-2 and VDD1-N and the power supply voltage VDD1-1 of which the voltage level is dynamically changed while being maintained to be higher than or equal to that of the minimum power supply voltage VMR is supplied to the corresponding memory core MC2 and MCN. Accordingly, the operation stability of the memory cores MC1, MC2 and MCN may be ensured while the power consumption of the SoC 300 may be reduced.

As described above, in the SoC 300 according to the example embodiments, the function circuits IP1, IP2 and IPN may be supplied with the power supply voltages VDD1-1, VDD1-2 and VDD1-N from the power sources 382, 384 and 386, respectively, and one 382 of the power sources 382, 384 and 386 generating the power supply voltage VDD1-1 higher than or equal to the minimum power supply voltage required by the memory cores MC1, MC2 and MCN may be shared, thereby reducing the number of the power sources in the PMIC 360, the number of the passive elements and the number of the power supply lines between the PMIC 360 and the SoC 300.

Figure 7:
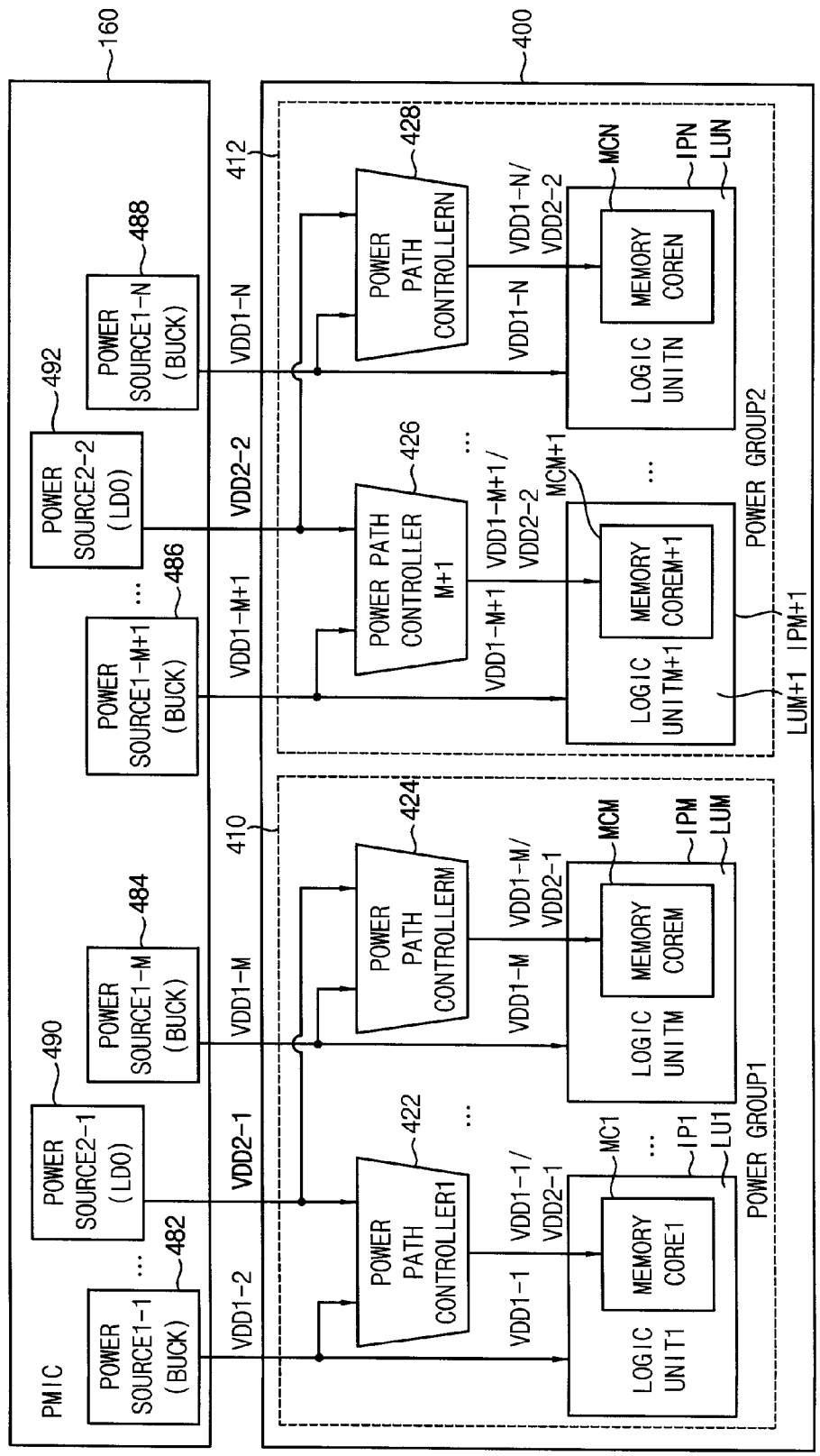
FIG. 7 is a block diagram illustrating a SoC according to example embodiments.

FIG. 7 is a block diagram illustrating a SoC according to example embodiments.

Referring to FIG. 7, a SoC 400 includes a plurality of function circuits IP1, IPM, IPM+1 and IPN, and a plurality of power path controller 422, 424, 426 and 428. The SoC 400 of FIG. 7 may have a similar configuration to a SoC 100 of FIG. 1, except that each second power source 490 and 492 is shared by a corresponding power group 410 and 412.

The function circuits IP1, IPM, IPM+1 and IPN may be coupled to a plurality of first power sources 482, 484, 486 and 488 included in a PMIC 460, respectively. A plurality of logic circuits LU1, LUM, LUM+1 and LUN respectively included in the function circuits IP1, IPM, IPM+1 and IPN (or peripheral circuits included in the logic circuits LU1, LUM, LUM+1 and LUN) may be supplied with a plurality of first power supply voltages VDD1-1, VDD1-M, VDD1-M+1 and VDD1-N from the first power sources 482, 484, 486 and 488, respectively.

Each power group 410 and 412 of the SoC 400 may share a corresponding second power source 490 and 492 included in the PMIC 460. For example, power path controllers 422 and 424 corresponding to the function circuits IP1 and IPM belonging to a first power group 410 may be respectively coupled to the first power sources 482 and 484 at first input terminals IN1, may be commonly coupled to the corresponding second power source 490 at second input terminals IN2, and may be respectively coupled to memory cores MC1 and MCM included in the function circuits IP1 and IPM belonging to the first power group 410 at output terminals OUT. Each memory core MC1 and MCM included in the function circuit IP1 and IPM belonging to the first power group 410 may be selectively supplied, by the corresponding power path controller 422 and 424, with the dynamically changed first power supply voltage VDD1-1 and VDD1-M from the corresponding first power source 482 and 484 or a fixed second power supply voltage VDD2-1 from the corresponding second power source 490.

Power path controllers 426 and 428 corresponding to the function circuits IPM+1 and IPN belonging to a second power group 412 may be respectively coupled to the first power sources 486 and 488 at first input terminals IN1, may be commonly coupled to the corresponding second power source 492 at second input terminals IN2, and may be respectively coupled to memory cores MCM+1 and MCN included in the function circuits IPM+1 and IPN belonging to the second power group 412 at output terminals OUT. Each memory core MCM+1 and MCN included in the function circuit IPM+1 and IPN belonging to the second power group 412 may be selectively supplied, by the corresponding power path controller 426 and 428, with the dynamically changed first power supply voltage VDD1-M+1 and VDD1-N from the corresponding first power source 486 and 488 or a fixed second power supply voltage VDD2-2 from the corresponding second power source 492.

As described above, in the SoC 400 according to the example embodiments, each second power source 490 and 492 may be shared by the corresponding power group 410 and 412, thereby reducing the number of the power sources in the PMIC 460, the number of the passive elements and the number of the power supply lines between the PMIC 460 and the SoC 400.

Figure 8:
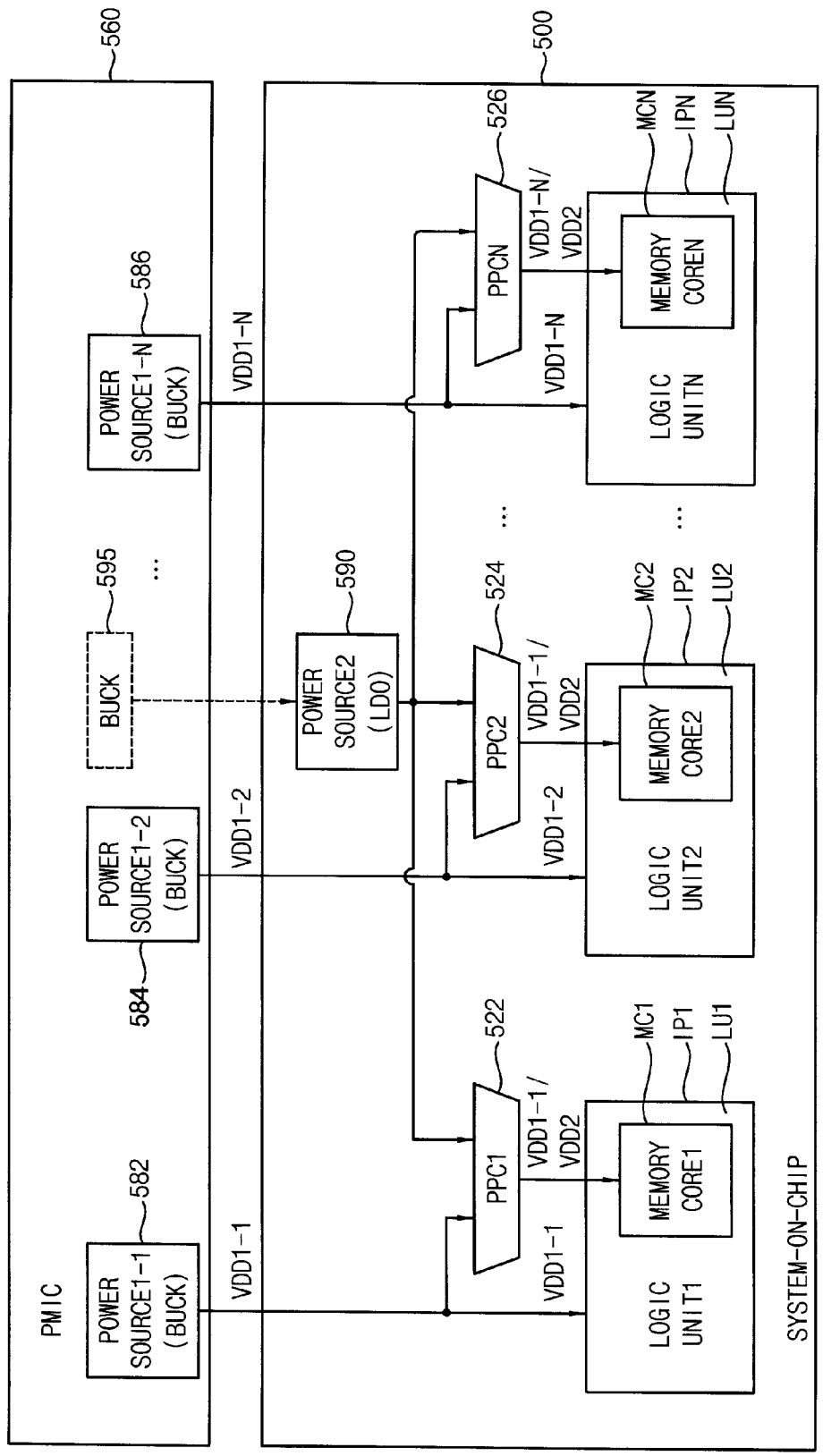
FIG. 8 is a block diagram illustrating a SoC according to example embodiments.

FIG. 8 is a block diagram illustrating a SoC according to example embodiments.

Referring to FIG. 8, a SoC 500 includes a plurality of function circuits IP1, IP2 and IPN, a plurality of power path controller 522, 524 and 526, and a second power source 590. The SoC 500 of FIG. 8 may have a similar configuration to a SoC 100 of FIG. 1, except that the second power source 590 is located inside the SoC 500.

The function circuits IP1, IP2 and IPN may be coupled to a plurality of first power sources 582, 584 and 586 included in a PMIC 560, respectively. A plurality of logic circuits LU1, LU2 and LUN respectively included in the function circuits IP1, IP2 and IPN (or peripheral circuits included in the logic circuits LU1, LU2 and LUN) may be supplied with a plurality of first power supply voltages VDD1-1, VDD1-2 and VDD1-N from the first power sources 582, 584 and 586, respectively.

A plurality of power path controllers 522, 524 and 526 may be respectively coupled to the first power sources 582, 584 and 586 included in the PMIC 560 located outside the SoC 500, may be commonly coupled to the second power source 590 included in the SoC 500. The second power source 590 may generate a second power supply voltage VDD2 that is a fixed power supply voltage corresponding to the minimum power supply voltage required by memory cores MC1, MC2 and MCN. In some example embodiments, the second power source 590 may directly receive a power supply voltage from an external battery, and may convert the power supply voltage into the second power supply voltage VDD2. In other example embodiments, the power supply voltage from the external battery may be converted by a buck converter 595 included in the PMIC 560, and then may be converted into the second power supply voltage VDD2 by the second power source 590.

Each memory core MC1, MC2 and MCN may be selectively supplied, by the corresponding power path controller 522, 524 and 526, with the dynamically changed first power supply voltage VDD1-1, VDD1-2 and VDD1-N from the corresponding first power source 582, 584 and 586 or a fixed second power supply voltage VDD2 from the second power source 590. Accordingly, the operation stability of the memory cores MC1, MC2 and MCN may be ensured while the power consumption of the SoC 500 may be reduced.

Figure 9:
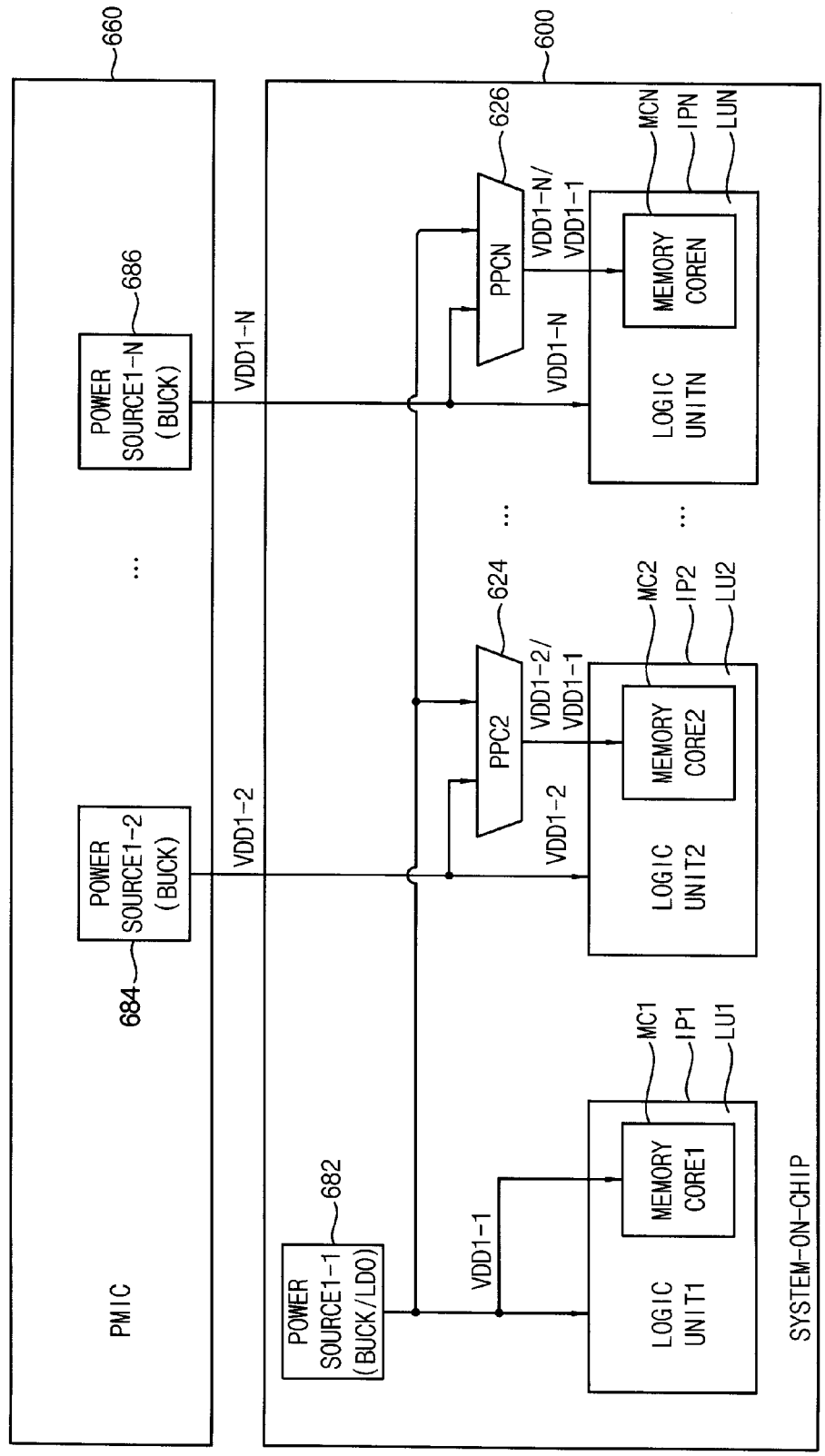
FIG. 9 is a block diagram illustrating a SoC according to example embodiments.

FIG. 9 is a block diagram illustrating a SoC according to example embodiments.

Referring to FIG. 9, a SoC 600 includes a plurality of function circuits IP1, IP2 and IPN, a plurality of power path controller 622, 624 and 626, and one power source 682 for one function circuit IP1 of the function circuits IP1, IP2 and IPN. The SoC 600 of FIG. 9 may have a similar configuration to a SoC 300 of FIG. 4, except that the one power source 682 is located inside the SoC 600.

The one function circuit IP1 of the function circuits IP1, IP2 and IPN may be coupled to the power source 682 located inside the SoC 600, and the other function circuits IP2 and IPN of the function circuits IP1, IP2 and IPN may be coupled to power sources 684 and 686 included in an external PMIC 660, respectively. A plurality of logic circuits LU1, LU2 and LUN respectively included in the function circuits IP1, IP2 and IPN (or peripheral circuits included in the logic circuits LU1, LU2 and LUN) may be supplied with a plurality of power supply voltages VDD1-1, VDD1-2 and VDD1-N from the power sources 682, 684 and 686, respectively.

The one power source 682 located inside the SoC 600 may supply a fixed power supply voltage VDD1-1 corresponding to a minimum power supply voltage required by memory cores MC1, MC2 and MCN, or a power supply voltage VDD1-1 that is dynamically changed according to the operating condition of the corresponding function circuit IP1 while a voltage level of the power supply voltage VDD1-1 is maintained to be higher than or equal to the voltage level of the minimum power supply voltage. The power sources 684 and 686 included in the PMIC 660 may supply power supply voltages VDD1-2 and VDD1-N that are dynamically changed according to operating conditions of the corresponding function circuits IP2 and IPN.

The memory core MC1 included in the function circuit IP1 may directly receive the power supply voltage VDD1-1 from the power source 682 located inside the SoC 600. The power path controllers 624 and 626 may be commonly coupled to the power source 682 located inside the SoC 600, and may selectively transfer the power supply voltage VDD1-2 and VDD1-N from the corresponding power source 684 and 686 included in the PMIC 660 or the power supply voltage VDD1-1 from the power source 682 located inside the SoC 600 to the corresponding memory core MC2 and MCN. Accordingly, the operation stability of the memory cores MC1, MC2 and MCN may be ensured while the power consumption of the SoC 600 may be reduced.

Figure 10:
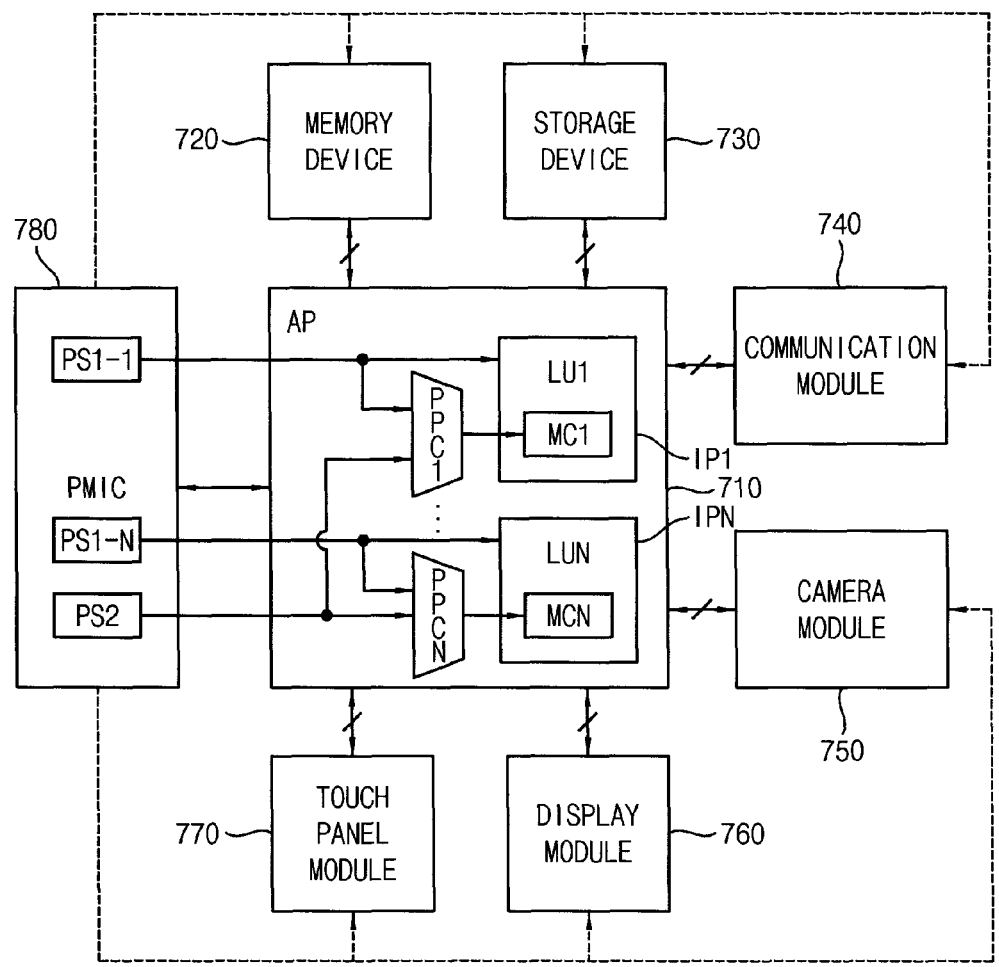
FIG. 10 is a block diagram illustrating a mobile device according to example embodiments.
Figure 11:
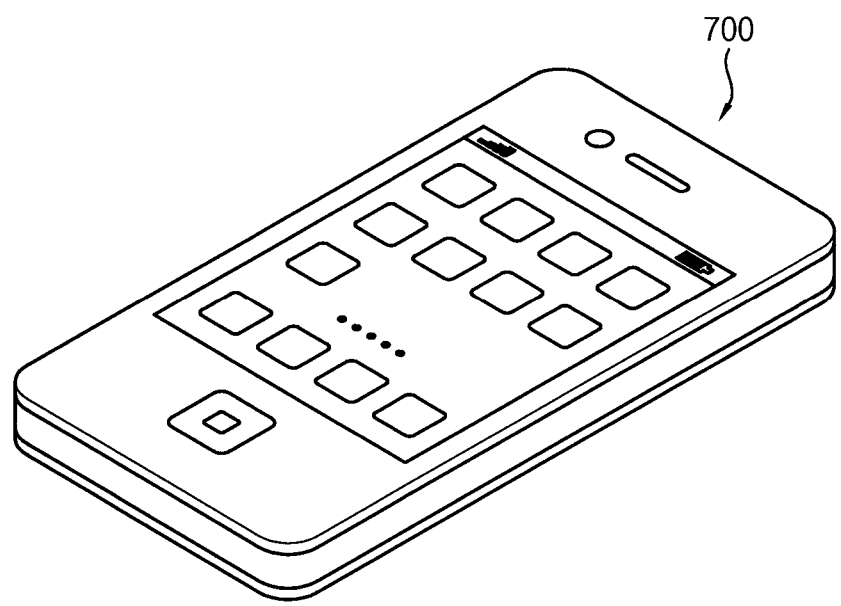
FIG. 11 is a schematic diagram illustrating an example in which the mobile device of FIG. 10 is implemented as a smart-phone.

FIG. 10 is a block diagram illustrating a mobile device according to example embodiments, and FIG. 11 is a schematic diagram illustrating an example in which the mobile device of FIG. 10 is implemented as a smart-phone.

Referring to FIGS. 10 and 11, a mobile device 700 (or an electronic device) includes a SoC 710 and a PMIC 780. In some example embodiments, the mobile device 700 may further include a plurality of devices or modules 720, 730, 740, 750, 760 and 770, such as a memory device 720, a storage device 730, a communication module 740, a camera module 750, a display module 760, a touch panel module 770, etc. For example, as illustrated in FIG. 11, the mobile device 700 may be implemented as a smart-phone.

The SoC 710 may control overall operations of the mobile device 700. For example, the SoC 710 may control the memory device 720, the storage device 730 and the plurality of modules 740, 750, 760 and 770. In some example embodiments, the SoC 710 may be an application processor (AP) included in the mobile device 700.

The SoC 710 may be one of the SoCs 100, 300, 400, 500 and 600 illustrated in FIGS. 1, 4, 7, 8 and 9, respectively, and may be supplied with power from the PMIC 780. The SoC 710 may include a plurality of function circuits IP1 and IPN and a plurality of power path controllers PPC1 and PPCN. A plurality of logic circuits LU1 and LUN included in the function circuits IP1 and IPN may be supplied with dynamically changed first power supply voltages from a plurality of first power sources PS1-1 and PS1-N included in the PMIC 780, respectively. The power path controllers PPC1 and PPCN may be respectively coupled to the first power sources PS1-1 and PS1-N included in the PMIC 780, and may be commonly coupled to at least one second power source PS2 included in the PMIC 780. The second power source PS2 may generate a fixed second power supply voltage. The power path controllers PPC1 and PPCN may selectively provide the dynamically changed first power supply voltage from the corresponding first power source PS1-1 and PS1-N or the fixed second power supply voltage from the second power source PS2 to corresponding memory cores MC1 and MCN, respectively. Accordingly, the SoC 710 according to the example embodiments may ensure a normal operation of the memory cores MC1 and MCN while reducing power consumption. Further, in the SoC 710 according to the example embodiments, the power path controllers PPC1 and PPCN may share (or may be commonly coupled to) the second power source PS2, thereby reducing the number of power sources, the number of passive elements and the number of power supply lines.

The memory device 720 and the storage device 730 may store data for operations of the mobile device 700. The memory device 720 may include a volatile memory device, such as a dynamic random access memory (DRAM), a SRAM, a mobile DRAM, etc. The storage device 730 may include a nonvolatile memory device, such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. In some example embodiments, the storage device 730 may further include a solid state drive (SSD), a hard disk drive (HDD), a CD-ROM, etc.

The plurality of modules 740, 750, 760 and 770 may perform various functions of the mobile device 700. For example, the mobile device 700 may include the communication module 740 that performs a communication function (e.g., a code division multiple access (CDMA) module, a long term evolution (LTE) module, a radio frequency (RF) module, an ultra-wideband (UWB) module, a wireless local area network (WLAN) module, a worldwide interoperability for a microwave access (WIMAX) module, etc.), the camera module 750 that performs a camera function, the display module 760 that performs a display function, the touch panel module 770 that performs a touch sensing function, etc. In some example embodiments, the mobile device 700 may further include a global positioning system (GPS) module, a microphone (MIC) module, a speaker module, a gyroscope module, etc. However, the functional modules 740, 750, 760, and 770 in the mobile device 700 are not limited thereto.

Figure 12:
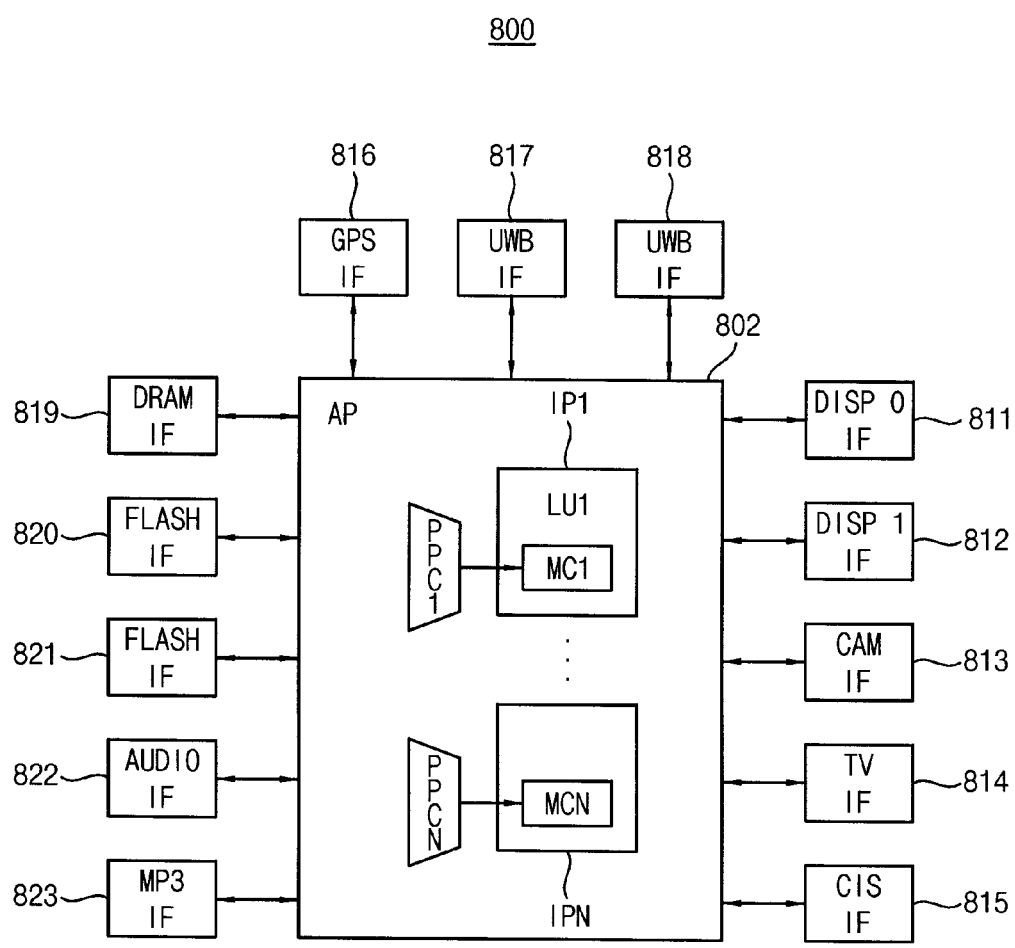
FIG. 12 is a block diagram illustrating an interface included in a mobile device according to example embodiments.

FIG. 12 is a block diagram illustrating an interface included in a mobile device according to example embodiments.

Referring to FIG. 12, a mobile device 800 includes a SoC 802 and a plurality of interfaces 811, 812, 813, 814, 815, 816, 817, 818, 819, 820, 821, 822 and 823. According to example embodiments, the mobile device 800 may be any mobile device, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc.

The SoC 802 controls overall operations of the mobile device 800. For example, the SoC 802 may be an application processor (AP) included in the mobile device 800.

The SoC 802 may communicate with each of a plurality of peripheral devices via each of the plurality of interfaces 811 through 823. For example, each of the interfaces 811 through 823 may transmit at least one control signal, which is output from a corresponding one of a plurality of function circuits IP1 and IPN, to each of the plurality of peripheral devices.

For example, the SoC 802 may control a power state and an operation state of each flat panel display device via each of display interfaces 811 and 812. The flat panel display device may include a liquid crystal display (LCD), a light emitting diode (LED) display, an organic light emitting diode (OLED) display or an active matrix organic light-emitting diode (AMOLED) display, etc.

The SoC 802 may control a power state and an operation state of a camcorder via a camcorder interface 813, may control a power state and an operation state of a TV module via a TV interface 814, and may control a power state and an operation state of a camera module or an image sensor module via an image sensor interface 815.

The SoC 802 may control a power state and an operation state of a GPS module via a GPS interface 816, may control a power state and an operation state of a UWB module via a UWB interface 817, and may control a power state and an operation state of an universal serial bus (USB) drive via a USB drive interface 818.

The SoC 802 may control a power state and an operation state of a DRAM via a DRAM interface 819, may control a power state and an operation state of a nonvolatile memory device (e.g., a flash memory) via a nonvolatile memory interface 820 (e.g., a flash memory interface), may control a power state and an operation state of an audio module through an audio interface 821, may control a power state of a multi-format codec (MFC) through an MFC interface 822, and may control a power state of an MP3 player through an MP3 player interface 823. For example, a module or an interface may be implemented in hardware or software.

The SoC 802 may be one of the SoCs 100, 300, 400, 500 and 600 illustrated in FIGS. 1, 4, 7, 8 and 9, respectively. The SoC 802 may include a plurality of function circuits IP1 and IPN and a plurality of power path controllers PPC1 and PPCN. A plurality of logic circuits LU1 and LUN included in the function circuits IP1 and IPN may be supplied with dynamically changed first power supply voltages, respectively. Each power path controller PPC1 and PPCN may selectively provide the dynamically changed first power supply voltage or a fixed second power supply voltage to a corresponding memory core MC1 and MCN. Accordingly, the SoC 802 according to the example embodiments may ensure a normal operation of the memory cores MC1 and MCN while reducing power consumption. Further, in the SoC 802 according to the example embodiments, the power path controllers PPC1 and PPCN may share (or may be commonly coupled to) the second power source, thereby reducing the number of power sources, the number of passive elements and the number of power supply lines.

Figure 13:
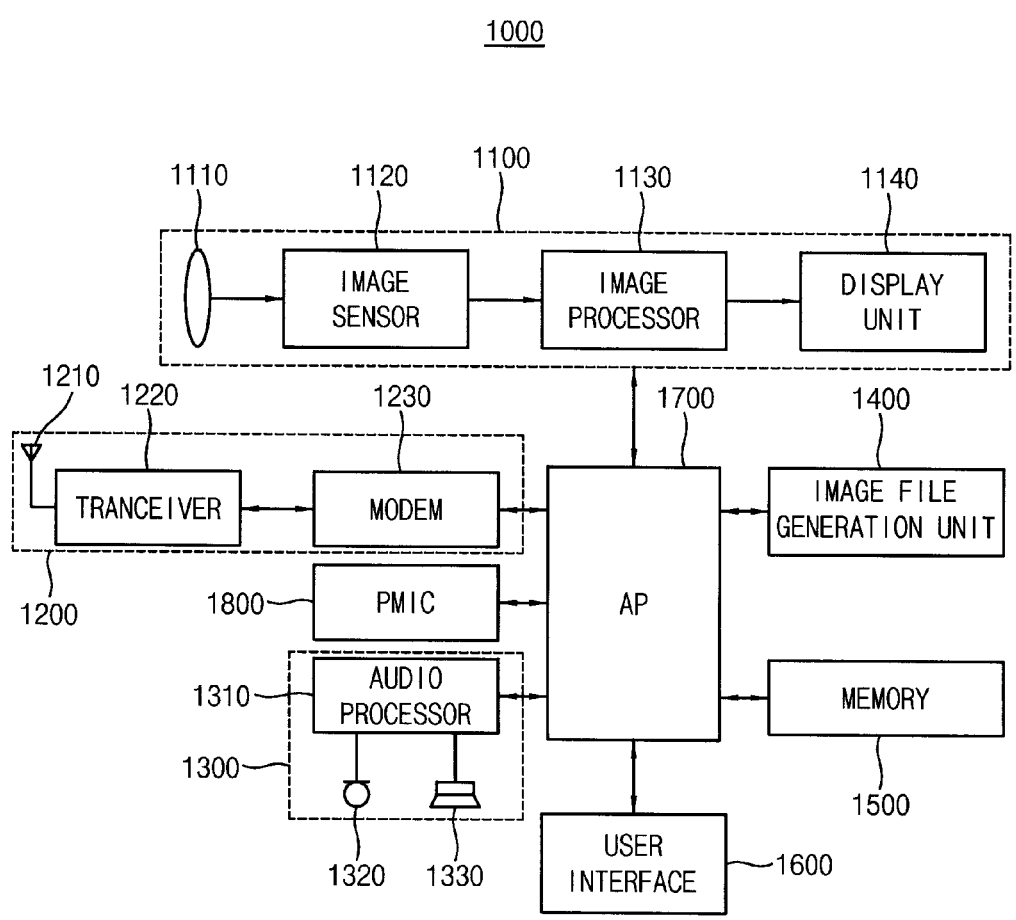
FIG. 13 is a block diagram illustrating an electronic device according to example embodiments.

FIG. 13 is a block diagram illustrating an electronic device according to example embodiments.

Referring to FIG. 13, an electronic device 1000 includes an image processing circuit 1100, a wireless transceiving circuit 1200, an audio processing circuit 1300, an image file generator 1400, a memory device 1500, a user interface 1600, an application processor 1700 and a PMIC 1800.

The image processing circuit 1100 may include a lens 1110, an image sensor 1120, an image processor 1130 and a display 1140. The wireless transceiving circuit 1200 may include an antenna 1210, a transceiver 1220 and a modem 1230. The audio processing circuit 1300 may include an audio processor 1310, a microphone 1320 and a speaker 1330.

The application processor 1700 may be one of the SoCs 100, 300, 400, 500 and 600 illustrated in FIGS. 1, 4, 7, 8 and 9, respectively. The application processor 1700 may be supplied with a plurality of first power supply voltages respectively corresponding to a plurality of function circuits or a plurality of power domains from the PMIC 1800, and the first power supply voltages may be dynamically changed to reduce power consumption of the application processor 1700. Further, the application processor 1700 may be supplied with a fixed second power supply voltage corresponding to a minimum power supply voltage required by a plurality of memory cores included in the application processor 1700 from the PMIC 1800. The application processor 1700 may selectively provide the first power supply voltage or the second power supply voltage to each memory core by using a plurality of power path controllers respectively corresponding to the plurality of memory cores, and thus may ensure the normal operation of the memory cores while reducing the power consumption. Further, the application processor 1700 may receive the second power supply voltage from a single or reduced number of power sources, thereby reducing the number of power sources, the number of passive elements and the number of power supply lines.

At least one of the components, elements or units represented by a block as illustrated in FIGS. 1, 3, 4 and 7-10 (e.g., power path controller 122 in FIG. 1, switch controller 230 in FIG. 3) may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a CPU that performs the respective functions, a microprocessor, or the like. Two or more of these components, elements or units may be combined into one single component, element or unit which performs all operations or functions of the combined two or more components, elements of units. Further, although a bus is not illustrated in the above block diagrams, communication between the components, elements or units may be performed through the bus. Functional aspects of the above exemplary embodiments may be implemented in algorithms that execute on one or more processors. Furthermore, the components, elements or units represented by a block or processing steps may employ any number of related art techniques for electronics configuration, signal processing and/or control, data processing and the like.

According to example embodiment, the functions or operations performed by the various components, elements or units in FIGS. 1, 3, 4 and 7-10 may be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), RAM, CD-ROMs, magnetic tapes, floppy disks, and optical data storage devices. The transmission medium can include carrier waves transmitted through the Internet or various types of communication channel. The computer readable recording medium can also be distributed over network coupled computer systems so that the computer readable code is stored and executed in a distributed fashion.

According to example embodiments, there is provided a method of controlling an SoC which may include the functions or operations performed by the various components, elements or units in FIGS. 1, 3, 4 and 7-10. Since these functions and operations will be duplicate, detailed descriptions thereof are omitted.

The example embodiments disclosed herein may be used in various kinds of SoCs or a system including the SoCs, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible to the example embodiments without materially departing from the novel teachings and advantages of the inventive concept. Accordingly, all such modifications are intended to be included within the scope of the inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A system-on-chip (SoC) comprising:
a plurality of function circuits each of which comprises a logic circuit and a memory; and
a plurality of power path controllers respectively coupled to a plurality of first power sources at first input terminals, commonly coupled to a second power source at second input terminals, and respectively coupled to the memories at output terminals,
wherein the logic circuits are respectively coupled to the first power sources, and configured to be supplied with a plurality of first power supply voltages from the first power sources, respectively,
wherein each of the memories is configured to be selectively supplied, by a corresponding one of the power path controllers, with one of a corresponding one of the first power supply voltages from a corresponding one of the first power sources and a second power supply voltage from the second power source, and
wherein each power path controller is configured to transfer the corresponding one of the first power supply voltages from the corresponding one of the first power sources to a corresponding one of the memories in response to the corresponding one of the first power supply voltages having a voltage level higher than a voltage level of the second power supply voltage, and transfer the second power supply voltage from the second power source to the corresponding one of the memories in response to the corresponding one of the first power supply voltages having a voltage level lower than the voltage level of the second power supply voltage.

2. The SoC of claim 1, wherein each of the first power supply voltages is a power supply voltage which is dynamically changed according to an operating condition of a corresponding one of the function circuits, and
wherein the second power supply voltage is a fixed power supply voltage.

3. The SoC of claim 1, wherein the power path controllers are respectively coupled to the first power sources through a plurality of first power supply lines, and are commonly coupled to the second power source through a single second power supply line.

4. The SoC of claim 1, wherein each power path controller comprises:
a first switch located between the corresponding one of the first power sources and the corresponding one of the memories;
a second switch located between the second power source and the corresponding one of the memories;
a comparator configured to compare the corresponding one of the first power supply voltages from the corresponding one of the first power sources with the second power supply voltage from the second power source; and
a switch controller configured to activate the first switch in response to the corresponding one of the first power supply voltages having the voltage level higher than the voltage level of the second power supply voltage, and activate the second switch in response to the corresponding one of the first power supply voltages having the voltage level lower than the voltage level of the second power supply voltage.

5. The SoC of claim 1, wherein the first power supply voltage supplied from one of the first power sources is a fixed power supply voltage, and the first power supply voltages supplied from the others of the first power sources are power supply voltages which are dynamically changed according to operating conditions of corresponding ones of the function circuits, and
wherein the second input terminals of the power path controllers are commonly coupled to, as the second power source, the one of the first power sources supplying the fixed power supply voltage.

6. The SoC of claim 1, wherein the first power sources are buck converters, and the second power source is a low dropout regulator.

7. The SoC of claim 1, wherein the first power sources and the second power source are included in a power management integrated circuit.

8. The SoC of claim 1, wherein the second power source is located inside the SoC.

9. A system-on-chip (SoC) of claim 1 further comprising another function circuit comprising a logic circuit and a memory which are configured to be supplied with the second power voltage from the second power source.

10. The SoC of claim 9, wherein each of the first power supply voltages is a power supply voltage which is dynamically changed according to an operating condition of a corresponding one of the function circuits, and
wherein the second power supply voltage is a fixed power supply voltage.

11. The SoC of claim 9, wherein each of the first power supply voltages is a power supply voltage which is dynamically changed according to an operating condition of a corresponding one of the function circuits, and
wherein the second power supply voltage is dynamically changed according to an operating condition of the other function circuit.

12. The SoC of claim 11, wherein the second power supply voltage is a voltage level higher than or equal to a voltage level of a minimum power supply voltage required by the memories respectively included in the function circuits and the memory included in the other function circuit.

13. A system-on-chip (SoC) of claim 1, wherein the second power source is included in the SoC.

14. The SoC of claim 13, wherein the second power source generates a fixed power supply voltage as the second power supply voltage.

15. An electronic device, comprising:
the SoC of claim 1; and
a power management integrated circuit which is connected to the SoC and comprises:
the plurality of first power sources configured to generate the first power supply voltages each of which is dynamically changed according to an operating condition of a corresponding one of the function circuits; and
the second power source configured to generate a fixed second power supply voltage.

16. A system-on-chip (SoC) comprising:
a first function circuit comprising a logic circuit and a first memory; and
a second function circuit comprising a second memory;
at least one power path controller coupled to at least one first power source and a second power source;
wherein the logic circuit is configured to be supplied with a first voltage, from the first power source, which is dynamically changed according to an operating condition of the first function circuit,
wherein the power path controller is configured to selectively supply each of the first and second memories with the first voltage from the first power source or a second voltage, from the second power source, which is the same as or higher than a minimum voltage required by the first and second memories,
wherein the power path controller is configured to supply each of the first and second memories with the first voltage or the second voltage which is higher than the other, and
wherein the second power source is one single power source.

17. The SoC of claim 16, wherein the second voltage is a fixed voltage.

18. The SoC of claim 16, wherein the second voltage is configured to be dynamically changed according to an operating condition of the second function circuit.

\* \* \* \* \*